(12) United States Patent
Kumar (10) Patent No.: US 8,946,673 B1
(45) Date of Patent: Feb. 3, 2015

(54) RESISTIVE SWITCHING DEVICE STRUCTURE WITH IMPROVED DATA RETENTION FOR NON-VOLATILE MEMORY DEVICE AND METHOD

(75) Inventor: Tanmay Kumar, Pleasanton, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/594,665

(22) Filed: Aug. 24, 2012

(51) Int. Cl.
*H01L 47/00* (2006.01)

(52) U.S. Cl.
USPC ............. 257/4; 257/2; 257/3; 257/5; 365/148

(58) Field of Classification Search
USPC ........................................................ 257/2–5
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,714,416 A | 2/1998 | Eichman et al. | |
| 5,751,012 A | 5/1998 | Wolstenholme et al. | |
| 5,840,608 A | 11/1998 | Chang | |
| 5,970,332 A | 10/1999 | Pruijmboom et al. | |
| 5,973,335 A | 10/1999 | Shannon | |
| 5,998,244 A | 12/1999 | Wolstenholme et al. | |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Office Action for U.S. Appl. No. 12/861,650 dated Oct. 16, 2012.

(Continued)

*Primary Examiner* — Matthew W Such
*Assistant Examiner* — Frederick B Hargrove
(74) *Attorney, Agent, or Firm* — Ogawa P.C.

(57) ABSTRACT

A non-volatile memory device structure includes a first conductor extending in a first direction, a second conductor extending in a second direction approximately orthogonal to the first direction, an amorphous silicon material disposed in an intersection between the first and second conductors characterized by a first resistance upon application of a first voltage, wherein the first resistance is dependent on a conductor structure comprising material from the second conductor formed in a portion of the resistive switching material, and a layer of material configured in between the second conductor and the amorphous silicon material, wherein the layer maintains at least a portion the conductor structure in the amorphous silicon material, and wherein the layer inhibits conductor species from the portion of the conductor structure from migrating away from the second conductor when a second voltage having an amplitude less than the first voltage is applied.

20 Claims, 4 Drawing Sheets

(56) References Cited

U.S. PATENT DOCUMENTS

| | | |
|---|---|---|
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,629,198 B2 | 12/2009 | Kumar et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 * | 11/2010 | Schricker et al. ............ 438/104 |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,441,835 B2 | 5/2013 | Jo et al. |
| 8,467,227 B1 * | 6/2013 | Jo ................................ 365/148 |
| 8,587,989 B2 | 11/2013 | Manning et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0202041 A1 | 10/2004 | Hidenori |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 * | 10/2009 | Chen et al. .................... 365/148 |
| 2009/0267047 A1 | 10/2009 | Sasago et al. |
| 2009/0298224 A1 | 12/2009 | Lowrey |

(56) References Cited

U.S. PATENT DOCUMENTS

| | | |
|---|---|---|
| 2009/0321789 A1 | 12/2009 | Wang et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0317470 A1 | 12/2011 | Lu et al. |
| 2012/0007035 A1* | 1/2012 | Jo et al. ............... 257/4 |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1* | 2/2012 | Jo et al. ............... 257/4 |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0269275 A1 | 10/2012 | Hannuksela |
| 2012/0305874 A1 | 12/2012 | Herner |
| 2013/0020548 A1 | 1/2013 | Clark et al. |
| 2013/0026440 A1* | 1/2013 | Yang et al. .......... 257/4 |
| 2014/0070160 A1 | 3/2014 | Ishikawa et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |
| WO | WO 2011/133138 A1 | 10/2011 |
| WO | WO 2011133138 A1 * | 10/2011 |

OTHER PUBLICATIONS

Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystaline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", INT. J. Electronics, 1992, pp. 897-906, vol. 73, No. 5, Taylor and Francis Ltd.

(56) References Cited

OTHER PUBLICATIONS

M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Patent Application No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, pp. 1-4.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, pubs.acs.org/NanoLett, pp. A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Electronic Switching in Amorphous-Semiconductor Thin Films", Chapter 14, pp. 640-701.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.

(56) References Cited

OTHER PUBLICATIONS

Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833/898 May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 14/072,657, dated Jun. 17, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 13/705,082, dated Sep. 2, 2014.
Notice of Allowance for U.S. Appl. No. 13/761,132, dated Sep. 4, 2014..
Notice of Allowance for U.S. Appl. No. 13/620,012, dated Sep. 9, 2014.
Notice of Allowance for U.S. Appl. No. 13/870,919, dated Sep. 9, 2014.
Office Action for U.S. Appl. No. 13/739,283, dated Sep. 11, 2014.
Office Action for U.S. Appl. No. 13/756,498, dated Sep. 12, 2014.
Notice of Allowance for U.S. Appl. No. 13/462,653 dated Sep. 17, 2014.
Notice of Allowance for U.S. Appl. No. 13/586,815, dated Sep. 18, 2014.
Notice of Allowance for U.S. Appl. No. 13/920,021, dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,941, dated Oct. 8, 2014.
Notice of Allowance for U.S. Appl. No. 13/077,941, dated Aug. 27, 2014.

* cited by examiner

RESISTIVE SWITCHING DEVICE STRUCTURE WITH IMPROVED DATA RETENTION FOR NON-VOLATILE MEMORY DEVICE AND METHOD

CROSS REFERENCE TO RELATED APPLICATIONS

Not Applicable

STATEMENTS RELATED TO GOVERNMENT OR FEDERALLY FUNDED RESEARCH

Not Applicable

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is generally related to resistive switching devices. More particularly, embodiments according to the present invention provide a device structure and a method to improve device performance of a resistive switching device. The present invention can be applied to non-volatile memory devices but it should be recognized that the present invention can have a much broader range of applicability.

The terms "bottom" and "top" are for purpose of illustration and reference only, and should not be limiting.

In a specific embodiment, a non-volatile memory device is provided. The device includes a bottom electrode, a top electrode, a resistive switching material disposed in an intersecting region of the first electrode and the bottom electrode. The first electrode comprises a first conductor material, the top electrode comprises a second conductor material and the resistive switching material comprises a silicon material (for example, an amorphous silicon material) in a specific embodiment. The resistive switching material is characterized by at least a first resistance upon application of a first voltage. In a specific embodiment, the first resistance is dependent on at least a first portion of a conductor structure comprising the second conductor material formed in a portion of the resistive switching material. In a specific embodiment, the device includes a layer of material configured between the bottom electrode and the resistive switching material. The layer of material is configured to maintain at least the first portion the first conductor structure in the portion of the resistive switching material and acts as a barrier region to maintain conductor species from the first conductor structure from migrating to another portion of the resistive switching material when a second voltage having an amplitude less than the first voltage is applied. The second voltage can be, for example, a read voltage for the non-volatile memory device.

According to one aspect of the invention, a non-volatile memory device is disclosed. According to one aspect of the invention, a non-volatile memory device structure is disclosed. One device includes a bottom electrode comprising a first conductor material extending in a first direction, and a top electrode comprising a second conductor material extending in a second direction, the first direction being approximately orthogonal to the second direction. One device includes a resistive switching material comprising an amorphous silicon-containing material disposed in an intersection region between the bottom electrode and the top electrode, the resistive switching material being characterized by at least a first resistance upon application of a first voltage, the first resistance being dependent on at least a first portion of a conductor structure comprising the second conductor material formed in a portion of the resistive switching material, and a layer of material configured in between the bottom electrode and the resistive switching material, the layer of material being configured to maintain at least the first portion the conductor structure in the portion of the resistive switching material, the layer of material acting as a barrier region to inhibit conductor species from the conductor structure from migrating away from the bottom electrode when a second voltage having an amplitude less than the first voltage is applied.

According to another aspect of the invention, a non-volatile memory device structure is described. One device includes a bottom electrode comprising a metal material extending in a first direction, a contact layer comprising a doped silicon-containing material disposed above the bottom electrode, and a top electrode comprising a metal material extending in a second direction, the first direction being approximately orthogonal to the second direction. One device includes a resistive switching material comprising an amorphous silicon-containing material disposed above the contact layer and disposed in an intersection region between the bottom electrode and the top electrode, wherein the resistive switching material is characterized by at least a first resistance upon application of a first voltage across the top electrode and bottom electrode, wherein the first resistance is dependent on at least a first portion of a conductor structure formed in a portion of the resistive switching material, and wherein the conductor structure is formed from the metal material of the top electrode, and a layer of material disposed above the contact layer and below the resistive switching material, wherein the layer of material is configured to inhibit conductor species from the conductor structure from migrating away from the bottom electrode when a second voltage having an amplitude less than the first voltage is applied across the top electrode and the bottom electrode.

Many benefits can be achieved by ways of the present invention. Embodiments of the present invention provide a device structure and a method to maintain a predetermined resistance state of the resistive switching device and to improve data retention characteristic of the device. The present device can be fabricated using conventional process techniques without modification to the process equipment. Depending upon the embodiment, one or more of these benefits may be achieved. One skilled in the art would recognize other modifications, variations, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is generally related to resistive switching devices. More particularly, embodiments according to the present invention provide a device structure and a method to improve device performance of a resistive switching device The present invention can be applied to improving data retention characteristic of non-volatile memory devices, but it should be recognized that embodiments according to the present invention can have a much broader range of applicability Some embodiments of a resistive switching device include a two terminal device including a top electrode, a bottom electrode and a resistive switching material disposed between the top electrode and the bottom electrode. The resistive switching material is characterized by a resistance dependent on an electric field upon an application of a suitable voltage to one of the electrodes. The electric field causes a conductor path to form in the resistive switching material. Depending on the electrode material and the resistive switching material used, the conductor path can be formed from the electrode material or defect path in the presence of the electric field. The conductor path determines the resistance of the resistive switching material. For example, for a metal oxide material as the switching material, the conductor path can form from oxygen deficient sites in the metal oxide. For a silicon material as the switching material, the conductor path can be formed from the electrode material, which comprises an active metal material. The resistive switching material is in a high conductance state. The conductor path is broken or retracts when a reverse bias voltage is applied and causes the resistive switching material to be in a low conductance state. The resistance of the resistive switching material has a resistance depending on the voltage and provide for a multi-level or multi-bit device. Therefore the conductor path structure needs to be stable under selected voltage, forward bias voltage, or reverse bias voltage for proper data retention.

Embodiments according to the present invention provide a device structure and a method for a resistive switching device characterized by a stable conductive path when a predetermined voltage is applied and a reliable data retention characteristic for the device.

Figure 1:
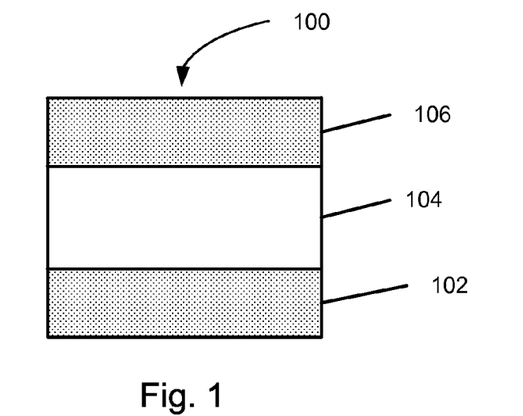
FIGS. 1 and 2 are simplified diagrams illustrating a resistive switching device according to an embodiment of the present invention.

FIG. 1 is a simplified diagram illustrating a resistive switching device 100 according to an embodiment of the present invention. The resistive switching device includes a first electrode 102, a second electrode 106, and a resistive switching material 104 sandwiched between the first electrode and the second electrode.

In various embodiments, resistive switching device 100 is formed upon a semiconductor substrate (not shown). In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 2:
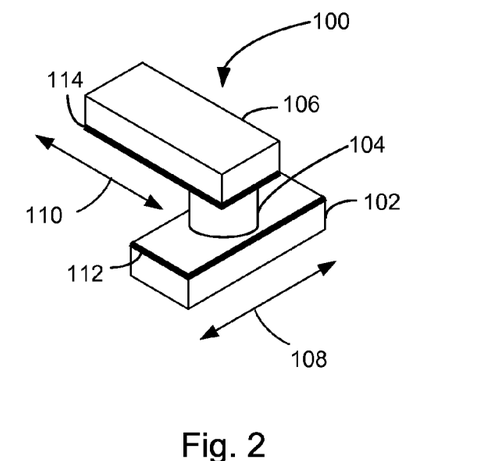

In various embodiments, in FIG. 2, the first electrode 102 can be a first conductor material. The first electrode 102 can include a first conductive material such as a first metal material and/or a doped semiconductor material 112. In a specific embodiment, the first metal material 102 can be tungsten, aluminum, copper or other suitable metal that are compatible with CMOS fabrication techniques. In additional embodiments, a doped semiconductor material 112 may be p-doped polysilicon, p-doped silicon germanium, or the like. In a specific embodiment, the first electrode is elongated in shape and configured to extend in a first direction 108.

The resistive switching material 104 can include a suitable insulator material having a resistance that can be altered upon application of an electric field to the insulator material. In a specific embodiment, the resistive switching material 104 can include a silicon material. For example, the silicon material can be an amorphous silicon material, a microcrystalline silicon material, a macro crystalline silicon material, a silicon germanium material including any combination of these. In a preferred embodiment, the silicon material includes an amorphous silicon material.

The resistive switching material 104 is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of polysilicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

In yet another embodiment, the resistive switching material/amorphous silicon material 104 may be formed from an upper region of a p+ polycrystalline silicon or p+ silicon germanium bearing layer (e.g. 112) using an Argon, Silicon, Oxygen plasma etch, or the like. For instance, a plasma etch may use a bias power within a range of approximately 30 watts to approximately 120 watts to convert an upper region of the polysilicon or silicon germanium material into a non-conductive amorphous silicon having p-type impurities (from the original polycrystalline silicon or silicon germanium bearing layer 112).

The second electrode 106 can be a second conductor material and can have a portion that includes a second metal material. The second metal material can be selected from aluminum, nickel, silver, gold, palladium, platinum, and others. The second metal material may have a suitable diffusivity in the switching material in a specific embodiment. In a specific embodiment, the second electrode is elongated in shape and configured to extend in a second direction 110 orthogonal to the first direction 108. In a specific embodiment, the second metal material includes a silver material.

As mentioned above, in certain embodiments, the resistive switching device 100 can include a contact material (112) disposed between the metal material of the first electrode 102 and the amorphous silicon material 104. In some embodiments, the contact material 112 provides a suitable interfacial defect characteristic for desirable switching behavior for the switching device 100. For amorphous silicon material as the switching material 104, the contact material 112 can be p+ polysilicon or p+ silicon germanium material. In certain embodiments, the contact material 112 can be optional.

In various embodiments, additional interposing layer(s) 114 may be disposed between resistive switching material 104 and second electrode 106. The additional layer 114 may include a material that has non-noble metal properties, e.g. the material oxidizes in the presence of oxygen. In some examples, the additional layer 114 may be titanium, titanium nitride, tungsten, tungsten nitride, or the like. In various embodiments, additional layer 114 may serve as an adhesion and/or bather layer between resistive switching material 104 and second electrode 106. In various embodiments, additional layer(s) 114 may be used to enhance retention, as will be described below.

In various embodiments, multiple resistive switching devices 100 can be disposed in an N by M crossbar array to form a high density interconnected array of non-volatile memory cells.

Figure 3:
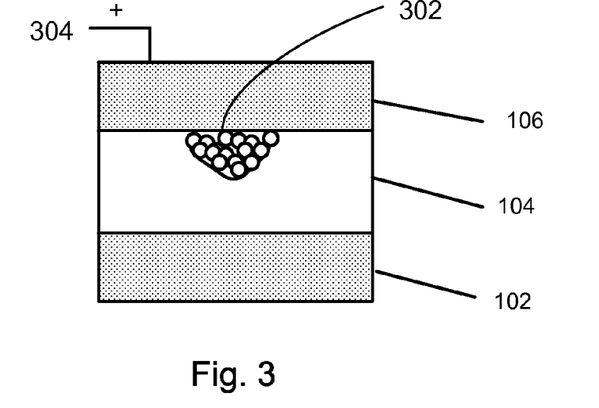
FIGS. 3-5 are simplified diagrams illustrating operations of a resistive switching device according to an embodiment of the present invention.
Figure 4:
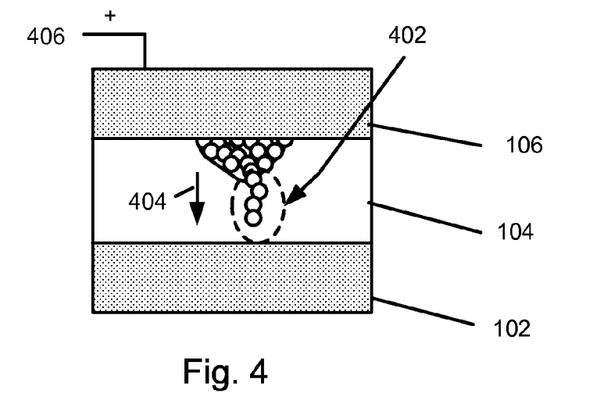
Figure 5:
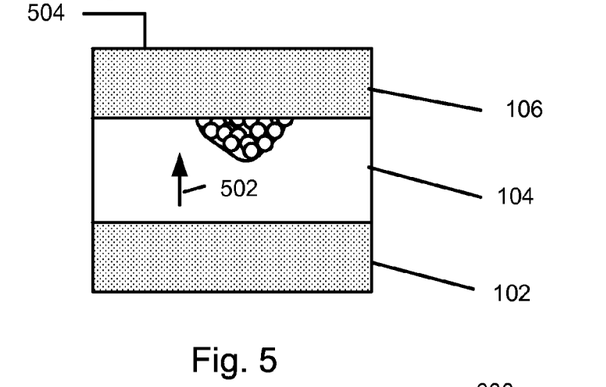

FIGS. 3-5 are simplified diagrams illustrating operations of the resistive switching device. As shown in FIG. 3, the second metal material 106 forms a metal region 302 in a portion of the switching material when a first positive voltage 304 greater than a threshold voltage is applied to the second electrode. The threshold voltage is the forming voltage for the resistive switching device.

As illustrated in FIG. 4, when a second positive bias voltage 406 (e.g. a write voltage) is applied to the second electrode 106, a filament region 402 is formed. Filament region 402 is typically characterized by a length, a first distance between metal particles, and/or a second distance between the filament and the first electrode 102. As shown in FIG. 4, the filament extends 404 towards the first electrode 102. In this configuration, the resistive switching device is now at a low resistance state.

In FIG. 5, the filament structure retracts 502 when a negative bias voltage 504 (e.g. an erase voltage) is applied to the second electrode 106 after the configuration illustrated in FIG. 4. In various embodiments, the resistive switching device is reverted back to a high resistance state. Accordingly, in some examples, the resistive switching device is a two-terminal device or a bipolar device.

Referring again to FIG. 4, the resistance state of the device is determined at least by the length of the filament structure, the distance between the metal particles in the filament structure, and the distance between the filament structure and the bottom electrode. As shown, the on-state current is determined by a tunneling current from the metal particle in the filament structure 402. As the device is cycled through read, write, and erase cycles, the filament structure may not maintain its desired structure. Additionally, in some embodiments, temperature effects resulting from current flows through the device, as well as from the ambience further degrade the filament structure. Degradation of the filament structure affects data retention characteristic for the device.

Figure 6:
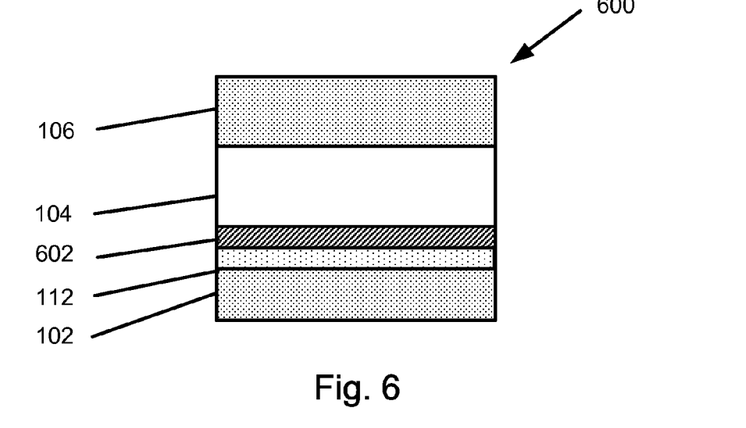
FIG. 6 is a simplified diagram illustrating a device structure for a resistive switching device according to an embodiment of the present invention.

FIG. 6 illustrates a device structure 600 for improving data retention for a resistive switching device according to some embodiments of the present invention. As shown, the device structure further includes a tunneling barrier layer 602 disposed in a portion of the resistive switching material between resistive switching material 104 and bottom electrode 102. For amorphous silicon as the resistive switching material 104, the tunneling layer 602 can alternatively be disposed sandwiched between a p+ polysilicon contact material 112 and bottom electrode 102 or between p+ polysilicon contact material 112 and resistive switching material 104 in some embodiments.

Figure 7:
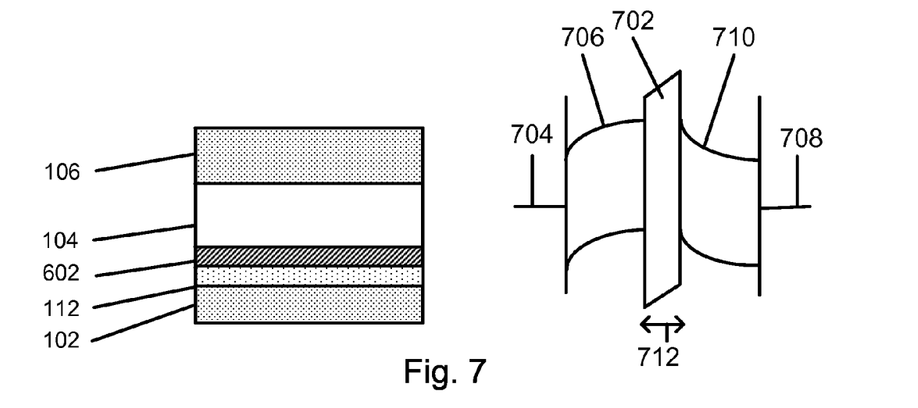
FIGS. 7-9 are simplified energy level diagrams for the resistive switching device according to an embodiment of the present invention.
Figure 8:
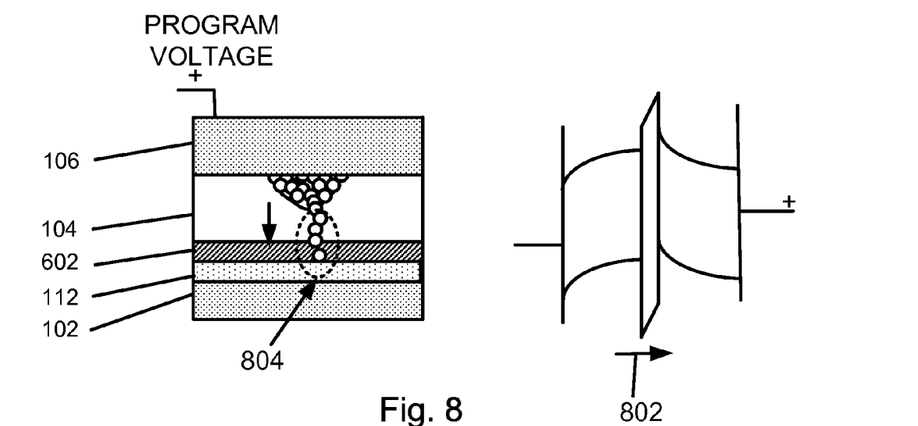
Figure 9:
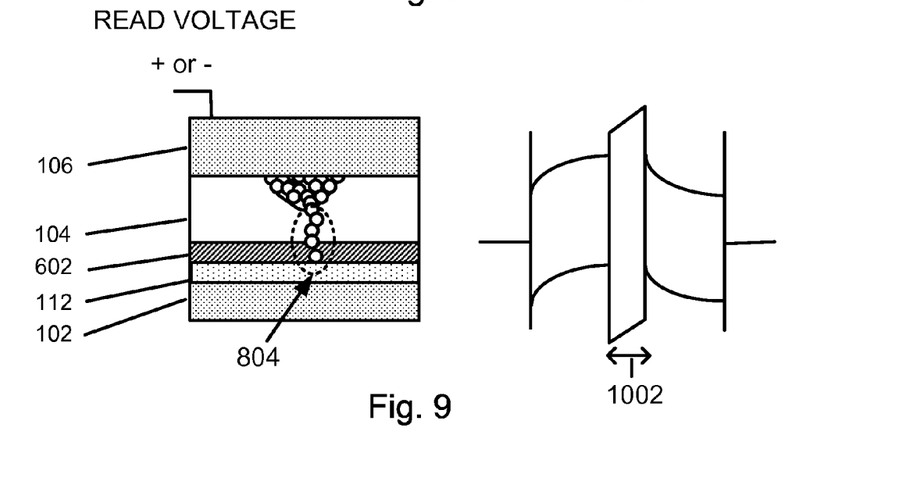

FIGS. 7-9 are simplified energy diagrams of the resistive switching device under conditions of no bias (or slight bias), forward bias, and reverse bias. As shown in FIG. 7, the tunneling barrier layer 602 is characterized by an energy band 702 having a barrier width 712. As shown, the bottom electrode 102 is at a first energy level 704 and the top electrode 106 is at a second energy level 708. The p+ polysilicon material 112 has a third energy level 706 and the amorphous silicon material 104 has a fourth energy level 710.

In operation, when a positive voltage is applied to the top electrode 106, the energy band 702 of the tunneling barrier layer 602 is extended and the barrier width is reduced, as illustrated in FIG. 8. Accordingly, the energy band is configured to facilitate or allow conductive particles 804 to tunnel through in a first direction 802 under a forward bias voltage. This causes the device to be at an ON state or a programmed state. The device is characterized by a low resistance state and an ON state current flows in the device.

Subsequently, when a small bias (forward or reversed) is applied to the device, for example in a read operation, or under no bias condition (as in FIG. 7), as illustrated in FIG. 9, conductive particles 804 that have tunneled through the tunneling barrier 602 now experience a large barrier 1002 in addition to the resistive switching material. Accordingly, conductive particles 804 are maintained in contact with tunneling barrier 602, and the device remains at a low resistance state.

Figure 10:
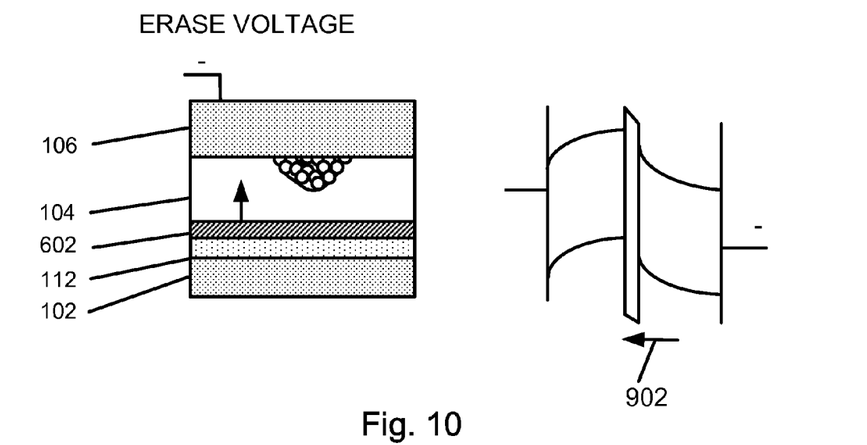
FIGS. 10-11 are simplified energy level diagrams for the resistive switching device under small bias conditions according to an embodiment of the present invention.
Figure 11:
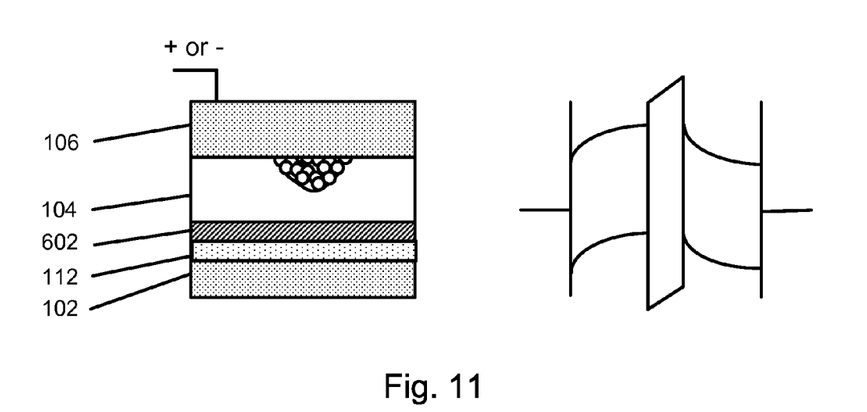

In FIG. 10, the energy band of the tunneling barrier layer 602 is further configured to allow conductive particles 804 to tunnel through in a second direction (back towards second conductor 106) under a reverse bias voltage (for example, an erase voltage). Accordingly, conductive particles 804 retract and the device is in a high resistance state as shown in FIG. 11.

Once retracted, the small bias voltage for read operation is again not large enough for the conductive particles 804 to tunnel through the tunnel barrier layer 602 to cause the device to go into a low resistance, programmed state. Accordingly, the tunnel barrier layer 602 is configured to maintain a resistance state of a resistance switching device under no bias or small bias condition.

Depending on the embodiment, the tunneling barrier layer 602 can have a suitable thickness, a suitable dielectric constant, or combination thereof. In some embodiments, the tunneling barrier layer 602 can have a thickness within a range of about 40 nm to about 50 nm depending on the dielectric constant; in some embodiments, tunneling barrier layer 602 can have a thickness of within a range of about 30 nm to about 20 nm; and in some embodiments, tunneling barrier layer 602 can have a thickness of within a range of about 10 nm to about 20 nm. The typical thickness is much larger than any incidental and unintentional native oxides, if any, that may form above any contact material 112.

Additionally, the tunneling barrier layer 602 is selected to be compatible with the resistive switching material 104 and the bottom electrode 102 in a specific embodiment. The tunneling barrier layer can be a dielectric material, or a semiconductor material, or a metal, including any combinations of these and others. In some embodiments, the tunneling barrier layer 602 may be a silicon nitride, a silicon oxide, titanium oxide, zinc oxide, or the like. In view of the present disclosure, one of ordinary skill in the art will recognize that many other materials that may be used for tunneling barrier layer 602.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device structure comprising:
    a bottom electrode comprising a first conductor material extending in a first direction;
    a top electrode comprising a second conductor material extending in a second direction, the first direction being approximately orthogonal to the second direction;
    a resistive switching material comprising an amorphous silicon-containing material disposed in an intersection region between the bottom electrode and the top electrode, the resistive switching material being characterized by at least a first resistance upon application of a first voltage, the first resistance being dependent on at least a first portion of a conductor structure comprising the second conductor material formed in a portion of the resistive switching material; and
    a layer of material configured in between the bottom electrode and the resistive switching material, the layer of material being configured to maintain at least the first portion the conductor structure in the portion of the resistive switching material, the layer of material acting as a tunneling barrier region configured to allow conductor species from the conductor to tunnel to the bottom electrode when the first voltage is applied and configured to inhibit conductor species from the conductor structure from migrating away from the bottom electrode when a second voltage having an amplitude less than the first voltage is applied.

2. The device of claim 1 wherein the first portion of the conductor structure is characterized by a filament structure having a length and a distance between conductor particles, the filament structure extending in a direction from the top electrode towards the bottom electrode upon application of the first voltage.

3. The device of claim 1 wherein the layer of material is selected from a group consisting of: a dielectric material, a semiconductor material, a metal oxide.

4. The device of claim 1 wherein the layer of material is further configured to allow the first portion of the conductor structure to retract upon application of a reversed bias voltage having an amplitude greater than the programming voltage and a polarity opposite to the programming voltage.

5. The device of claim 1 wherein the amorphous silicon-bearing material is selected from a group consisting of: an amorphous silicon, a microcrystalline silicon material, a silicon oxide, a silicon germanium material, and combinations thereof.

6. The device of claim 1 wherein the bottom electrode also comprises a contact layer comprising a material, wherein the material is selected from a group consisting of: doped polysilicon, and doped silicon germanium.

7. The device of claim 1 wherein the second conductor material is selected from a group consisting of: a noble metal, gold, platinum, silver, palladium, nickel, or aluminum.

8. The device of claim 1 wherein the layer of material is configured to provide a first tunneling threshold when a programming or erase voltage is not applied across the top electrode and the bottom threshold, and configured to provide a second tunneling threshold when the programming or the erase voltage is applied across the top electrode and the bottom threshold, and wherein the first tunneling threshold is greater than the second tunneling threshold.

9. The device of claim 8 wherein the second tunneling threshold is approximately half the first tunneling threshold.

10. The device of claim 1 wherein the layer of material has a thickness within a range of approximately 10 nm to approximately 50 nm.

11. A non-volatile memory device structure comprising:
a bottom electrode comprising a metal material extending in a first direction;
a contact layer comprising a doped silicon-containing material disposed above the bottom electrode;
a top electrode comprising a metal material extending in a second direction, the first direction being approximately orthogonal to the second direction;
a resistive switching material comprising an amorphous silicon-containing material disposed above the contact layer and disposed in an intersection region between the bottom electrode and the top electrode, wherein the resistive switching material is characterized by at least a first resistance upon application of a first voltage across the top electrode and bottom electrode, wherein the first resistance is dependent on at least a first portion of a conductor structure formed in a portion of the resistive switching material, and wherein the conductor structure is formed from the metal material of the top electrode; and
a layer of material disposed above the contact layer and below the resistive switching material, wherein the layer of material is configured to allow conductor species from the conductor to tunnel to the bottom electrode when the first voltage is applied and configured to inhibit conductor species from the conductor structure from migrating away from the bottom electrode when a second voltage having an amplitude less than the first voltage is applied across the top electrode and the bottom electrode.

12. The device of claim 11 wherein material from the layer of material is selected from a group consisting of: a dielectric material, a semiconductor material, a metal oxide, a metal material, a silicon nitride, a silicon oxide, titanium oxide, zinc oxide.

13. The device of claim 11
wherein the layer of material is configured to inhibit conductor species from the conductor structure from migrating away from the bottom electrode when a second voltage having an amplitude less than the first voltage is applied across the top electrode and the bottom electrode to a first degree;
wherein the layer of material is configured to inhibit conductor species from the conductor structure from migrating away from the bottom electrode when a second voltage having an amplitude approximately equal to the first voltage is applied across the top electrode and the bottom electrode to a second degree; and
wherein the first degree is greater than the second degree.

14. The device of claim 11 wherein the amorphous silicon-bearing material is selected from a group consisting of: an amorphous silicon, a microcrystalline silicon material, a silicon oxide, a silicon germanium material, and combinations thereof.

15. The device of claim 11 wherein the doped silicon-containing material is selected from a group consisting of: doped polysilicon, and doped silicon germanium.

16. The device of claim 11 wherein the second conductor material is selected from a group consisting of: a noble metal, gold, platinum, silver, palladium, nickel, or aluminum.

17. The device of claim 11 wherein the second conductor material comprises aluminum.

18. The device of claim 11 wherein the layer of material is configured to provide a first tunneling threshold when a programming or erase voltage is not applied across the top electrode and the bottom threshold, and configured to provide a second tunneling threshold when the programming or the erase voltage is applied across the top electrode and the bottom threshold, and wherein the first tunneling threshold is greater than the second tunneling threshold.

19. The device of claim 18 wherein the second tunneling threshold is approximately half the first tunneling threshold.

20. The device of claim 11 wherein the layer of material has a thickness within a range of approximately 20 nm to approximately 40 nm.

* * * * *